(12) United States Patent
McGrath

(10) Patent No.: US 6,373,416 B1
(45) Date of Patent: Apr. 16, 2002

(54) LOOKAHEAD SIGMA-DELTA MODULATOR

(75) Inventor: David Stanley McGrath, Sydney (AU)

(73) Assignee: Lake DSP Pty. Ltd., New S. Wales (AU)

(*) Notice: Subject to any disclaimer, the term of this patent is extended or adjusted under 35 U.S.C. 154(b) by 0 days.

(21) Appl. No.: 09/283,015

(22) Filed: Mar. 31, 1999

(30) Foreign Application Priority Data

Mar. 31, 1998 (AU) .............................................. PP2719

(51) Int. Cl.[7] ................................................ H03M 3/00
(52) U.S. Cl. ........................ 341/143; 341/144; 341/155
(58) Field of Search ................................ 341/143, 144, 341/155

(56) References Cited

U.S. PATENT DOCUMENTS

| | | | | |
|---|---|---|---|---|
| 5,243,345 A | * | 9/1993 | Naus et al. ................... | 341/143 |
| 5,341,135 A | * | 8/1994 | Pearce ......................... | 341/120 |
| 5,471,209 A | * | 11/1995 | Sutterlin et al. ............. | 341/143 |
| 5,574,452 A | * | 11/1996 | Longo et al. ................. | 341/143 |
| 5,598,159 A | * | 1/1997 | Hein ........................... | 341/143 |
| 5,689,449 A | * | 11/1997 | Saramaki et al. .......... | 364/724.1 |
| 5,732,003 A | * | 3/1998 | White et al. ............. | 364/724.01 |
| 6,087,968 A | * | 7/2000 | Roza ............................ | 341/143 |

OTHER PUBLICATIONS

Temes et al.; *Delta–Sigma Delta Converters, Theory, Design And Simulation*. Copyright 1997 IEEE Press, Chapter 10 only, entitled Architectures for ΔΣ Dacs, pp. 309–332.

* cited by examiner

*Primary Examiner*—Peguy JeanPierre
(74) *Attorney, Agent, or Firm*—Knobbe, Martens, Olson & Bear

(57) ABSTRACT

A sigma delta modulator apparatus comprising: input means for inputting a current input signal; differencing means for forming the difference between a current input signal and a current output signal; filtering means for filtering the difference so as to produce a filtered difference signal; and output means outputting a minimum or maximum output value so as to substantially minimize the filtered difference signal.

8 Claims, 3 Drawing Sheets

LOOKAHEAD SIGMA-DELTA MODULATOR

FIELD OF THE INVENTION

The present invention relates to the field of sigma delta modulators.

BACKGROUND OF THE INVENTION

Sigma delta modulators are becoming increasingly important in the DSP processing field and are useful in A/D conversion, one bit processing etc.

For a full discussion of the operation of Sigma Delta modulators, reference is made to one of the standard texts in the field. For example, "Delta-Sigma Data Converters—Theory, Design and Simulation", S. Norsworthy et. al., published 1997 by IEEE Press Marketing.

In any Sigma-Delta modulator, it is important to provide as faithful a reproduction or quanization of the original signal as possible. Importantly, any low frequency noise introduced in the quantization should be of as low an amplitude level as possible.

SUMMARY OF THE INVENTION

It is an object of the present invention to provide an improved form of Sigma Delta Modulator.

In accordance with a first aspect of the present invention, there is provided a sigma delta modulator apparatus comprising: input means for inputting a current input signal; differencing means for forming the difference between a current input signal and a current output signal; filtering means for filtering the difference so as to produce a filtered difference signal; output means outputting a minimum or maximum output value so as to substantially minimize the filtered difference signal.

The filter can be of the form:

$$G(z)=1+z^{-1} \cdot H(z)$$

In accordance with a further aspect of the present invention, there is provided a sigma delta modulator comprising: a differencing means for forming the difference between a current input signal and a current output signal to produce a difference output; delay means for storing and delaying the difference output, producing a delayed difference output; low pass filtering means for low pass filtering the delayed difference output producing a low pass output; summing means for summing the delayed difference output with a current input signal; to produce a current intermediate output; and quantizing means for quantizing the current intermediate output to a predetermined number of output states producing an output signal.

In accordance with a further aspect of the present invention, there is provided a method of computing a first series of B output signals samples from a second series of B input signals comprising the steps of: (a) computing the difference between a current input series and each possible output series; (b) for each of the possible output series, determining a low frequency part of a successive series of the differences; (c) amplifying the low frequency parts; (d) utilizing an output signal having a minimum low frequency part as an output signal.

BRIEF DESCRIPTION OF THE DRAWINGS

Notwithstanding other forms which may fall within the scope of the present invention, preferred forms of the invention will now be described, by way of example only, with reference to the accompanying drawings in which.

DESCRIPTION OF PREFERRED AND OTHER EMBODIMENTS

The preferred embodiment is directed to a new method for implementing Sigma Delta Modulators with four potential benefits.

1. Improved noise performance compared to traditional modulators of the same order.

2. Less DSP computational requirement compared to the DSP implementation of a traditional Sigma Delta Modulator.

3. The potential for removal of "limit cycle" artifacts by pseudo-random code-book swapping.

4. The potential for lower bit-rate storage and transmission of Sigma Delta Modulated bit-streams.

Figure 1:
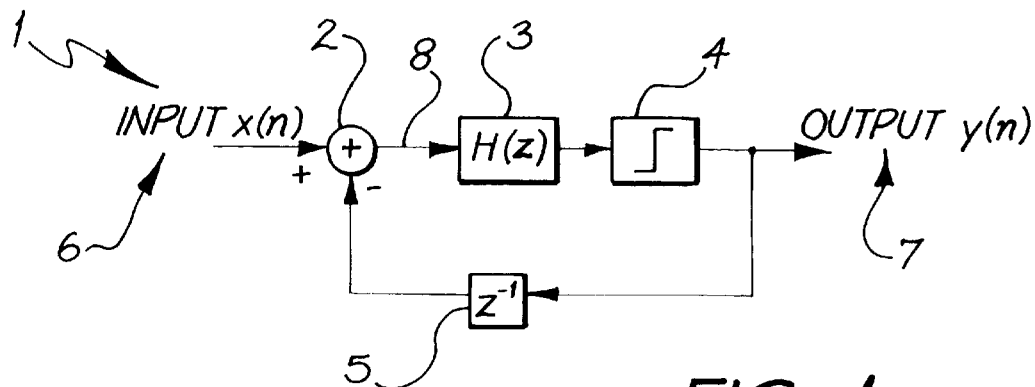
FIG. 1 illustrates schematically a standard sigma-delta modulator.
Figure 2:
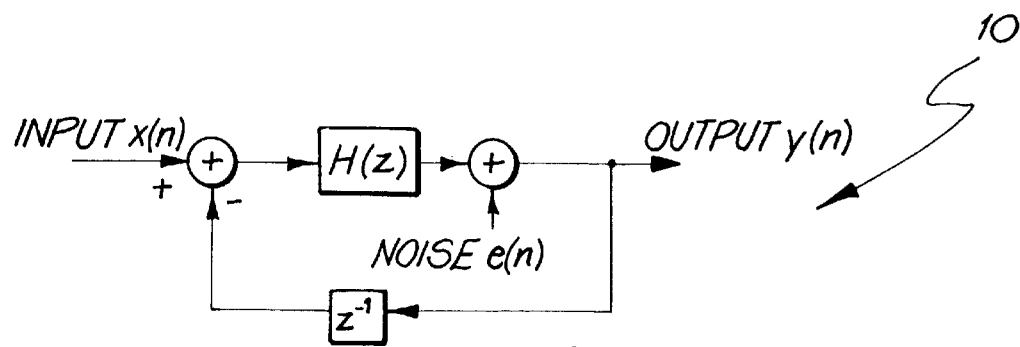
FIG. 2 illustrates schematically a noise model of the standard sigma-delta modulator.

The traditional Sigma Delta Modulator 1 is illustrated schematically in FIG. 1. The Sigma Delta Modulator 1 is composed of four elements, a summing node 2, where the feedback signal from the modulator output is subtracted from the input, a low-pass filter 3, which works to minimize the output noise at low frequencies, a one-bit quantiser 4, and the one-sample delay 5 in the feedback loop. In general, the quantiser can be treated as a simple noise source, passing the input 6 through to the output 7 and adding noise at the same time. The corresponding noise-model is shown 10 in FIG. 2.

There are two transfer functions. The noise transfer function:

$$Y(z) = \frac{1}{1 + H(z) \cdot z^{-1}} E(z) \qquad \text{(Eqn 1)}$$

and the signal transfer function:

$$Y(z) = \frac{H(z)}{1 + H(z) \cdot z^{-1}} X(z) \qquad \text{(Eqn 2)}$$

In this case, it is assumed that the input and output are both digital signals, sampled at the Sigma Delta Modulator's sample rate. The input x(n) is normally a high-precision signal (maybe floating point or long-wordlength fixed point) and the output y(n) is binary (+1,−1)

If the transfer function H(z) has a very high gain at low frequency (which is commonly the case) then the noise transfer function will have very low gain at low frequencies and the signal transfer function will be close to unity. This is the standard way such modulators are analyzed in the literature.

The only problem with this analysis is that it ignores the $z^{-1}$ in the denominator of the signal transfer function (Eqn 2). This equates to a z in the numerator which implies that the system has a negative group delay of one sample period at low frequencies. Looking at FIG. 1, this will be evident. The H(z) filter 3 in the top of the loop is acting to amplify the low frequency part of the difference signal from the adder 2. Overall, the loop attempts to make the difference signal 8 minimized at low frequencies. This difference signal is made up of the current input sample and the old output sample. So, in other words, the loop is trying to make sure that the previous output sample was a close match to the next input sample. This means that the loop is trying to look into the future.

At a sample rate of 3.072 MHz (for example), trying to estimate 325 ns into the future is not overly difficult, when the primary concern is the low-frequency part of the signal (below 20 KHz, say).

Looking again at the modulator block diagram in FIG. 1, we see that the Adder 2, the Filter H(z) 3, and the 1-bit comparator 4 are doing the following:

Adder 2: Compute the error (difference between input x(n) and output y(n−1)).

Filter 3: Amplify the low-frequency part of the error (this is the frequency band where the noise is desirably lower).

Comparator 4: Based on this low-passed error, decide on the value of the next output sample y(n).

Now, note that the current error signal (x(n)−y(n−1)) is used to generate the next output sample y(n). If, instead, the current error signal (x(n)−y(n)) is used to generate the current output y(n), a difference in the behavior of the modulator would be expected.

Figure 3:
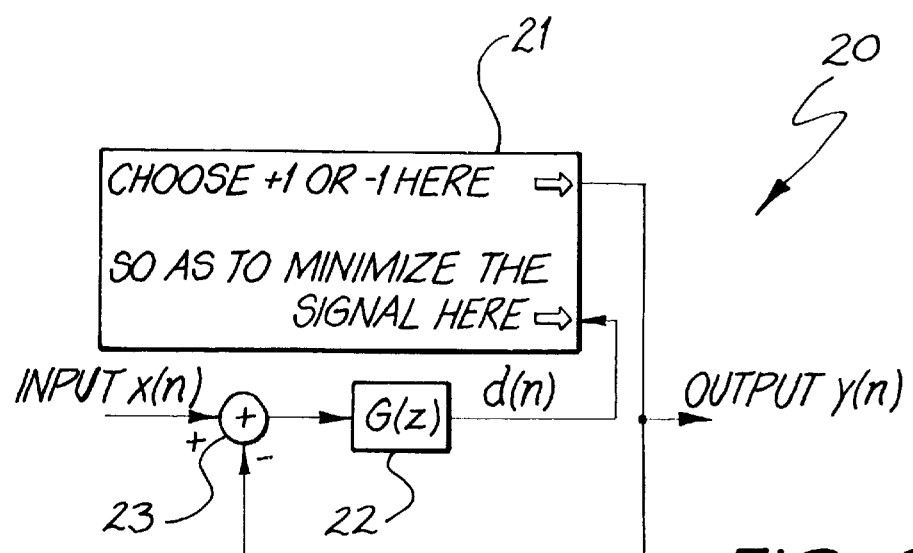
FIG. 3 illustrates schematically the preferred embodiment.

One such arrangement is illustrated 20 in FIG. 3.

Now, note that this block diagram implies that we choose y(n)=+1 and then compute the next output sample, $d_1(n)$ from G(z) 22, then repeat the calculation using y(n)=−1 to compute $d_{-1}(n)$. Whichever choice 21 of y(n) results in the lowest output sample at G(z) 22 is the value that will be chosen. In other words, if $|d_1(n)|<|d_{-1}(n)|$, then it is desirable to choose y(n)=1, and if $|d_1(n)|>|d_{-1}(n)|$, then it is desirable to choose y(n)=−1.

It turns out that a good choice for G(z) 22 is:

$$G(z)=1+z^{-1}\cdot H(z) \quad \text{Eqn 3}$$

Where H(z) is the filter that would have been used in a traditional Sigma Delta Modulator 1 of FIG. 1. This filter function will be examined in further detail below, to see how it affects the noise transfer function and the signal transfer function.

We can take the arrangement 20 of FIG. 3 and extend the principle in the following way:

Collect B successive input samples x(n), x(n+1), . . . x(b+B−1)

Choose a possible string of output sample for y(n), y(n+1), . . . y(n+B−1). Clearly, there are $2^B$ possible choices in the case where the Sigma Delta Modulator is producing single bit outputs.

Test each of the $2^B$ possible choices and determine which one results in the lowest overall amplitude of the error samples d(n), d(n+1), . . . d(n+B−1). [Note there are many different ways to measure the amplitude of the error signal]. In an alternative embodiment, the output series can be selected from a set of alternative values wherein the set is smaller then $2^B$ in size.

If only a single sample lookahead is used, we can reformulate the method, so that it is more deterministic and therefore more easily analyzed. This process starts by looking at how $d_1(n)$ and $d_{-1}(n)$ are computed. We can compute $d_0(n)$, which is the value we would find at d(n) if we have zero at our output (i.e. if y(n)=0). It now turns out that $d_2(n)=d_0(n)-1$, and $d_{-1}(n)=d_0(n)+1$. Clearly, if $d_0(n)<0$, then $|d_1(n)|>|d_{-1}(n)|$, and we will choose y(n)=−1. Alternatively, if $d_0(n)>0$, then $|d_1(n)|<|d_{-1}(n)|$, and we will choose y(n)=1.

Figure 4:
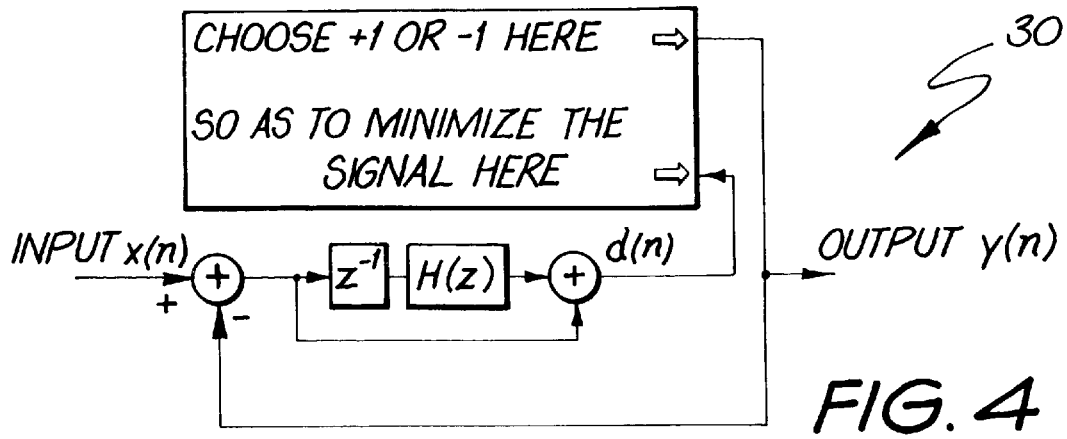
FIG. 4 illustrates schematically the preferred embodiment with G(z) expanded in terms of H(z)

Now it is possible to expand our block diagram, firstly to show how G(z) is built up using H(z) as set out in Eqn 4 and as shown 30 in FIG. 4.

Figure 5:
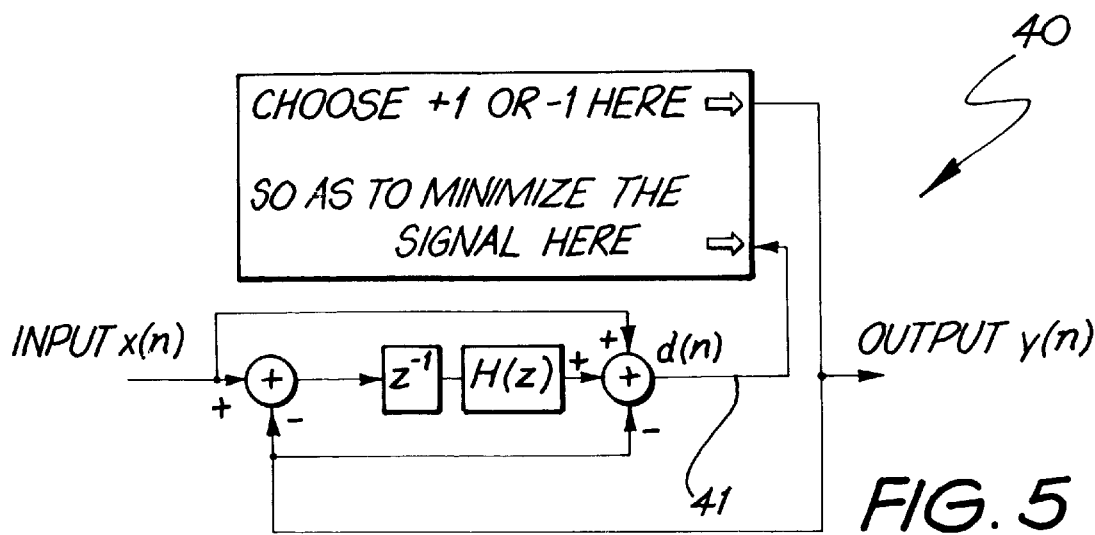
FIG. 5 illustrates schematically the preferred embodiment re-arranged.

It is possible to modify the arrangement of FIG. 4 slightly to get the result 40 of FIG. 5.

Now, this block diagram shows that we compute d(n) 41 at every sample period. Following the logic in the preceding paragraphs, it eventuates that we do not need to actually compute d(n), since only $d_0(n)$ is needed to allow us to make a choice of y(n). So, it is possible to modify the block diagram further as shown 50 in FIG. 6.

Figure 7:
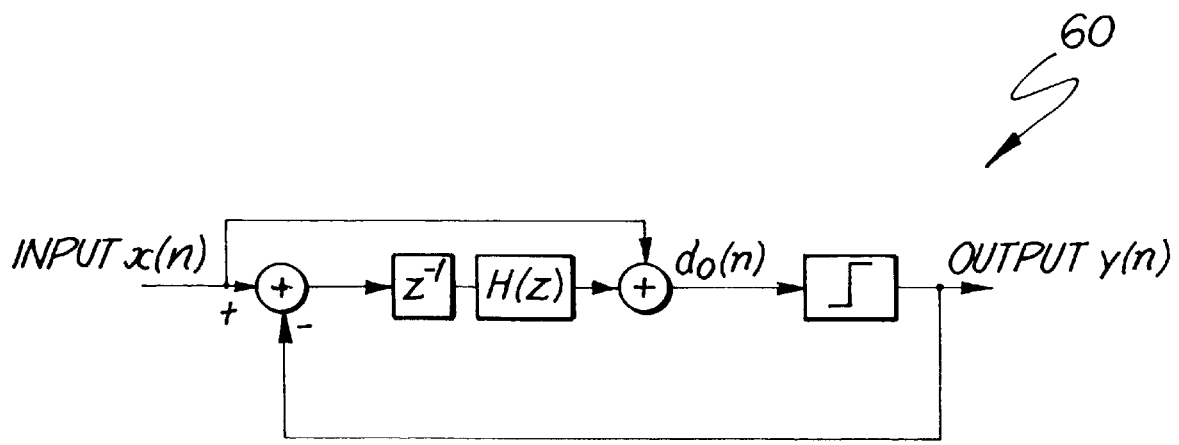
FIG. 7 illustrates schematically a single sample lookahead modulator.

Now, we used the algorithm that said, if d0(n)<0, then choose y(n)=−1, and if d0(n)>0, then choose y(n)=+1. This can be achieved using a single comparator (just like a traditional Sigma Delta Modulator) resulting in an arrangement 60 as shown in FIG. 7.

Figure 8:
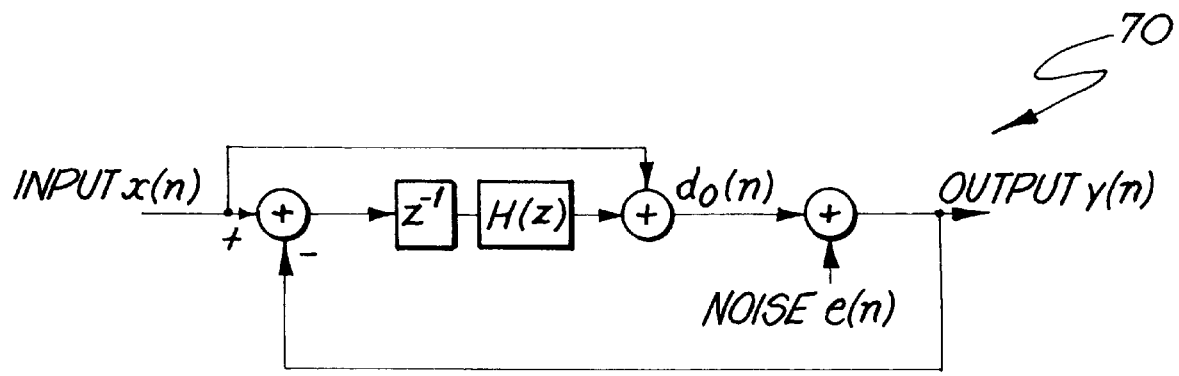
FIG. 8 illustrates schematically the noise model of a single sample lookahead modulator.

As we did with the original Sigma Delta Modulator, we can model the comparator as a noise source (summing noise into the loop). The noise model is shown 70 in FIG. 8.

As before, it is possible to compute the noise transfer function (which is the same as for the standard Sigma Delta Modulator):

$$Y(z) = \frac{1}{1+H(z)\cdot z^{-1}} E(z) \quad \text{Eqn 4}$$

But the signal transfer function is very simply:

$$Y(z)=X(z) \quad \text{Eqn 5}$$

This unitary noise transfer function is important for two reasons. Firstly, it is not compromising the frequency response of the signal, and secondly, it shows that this system is not attempting to do forward prediction of the output samples.

Figure 6:
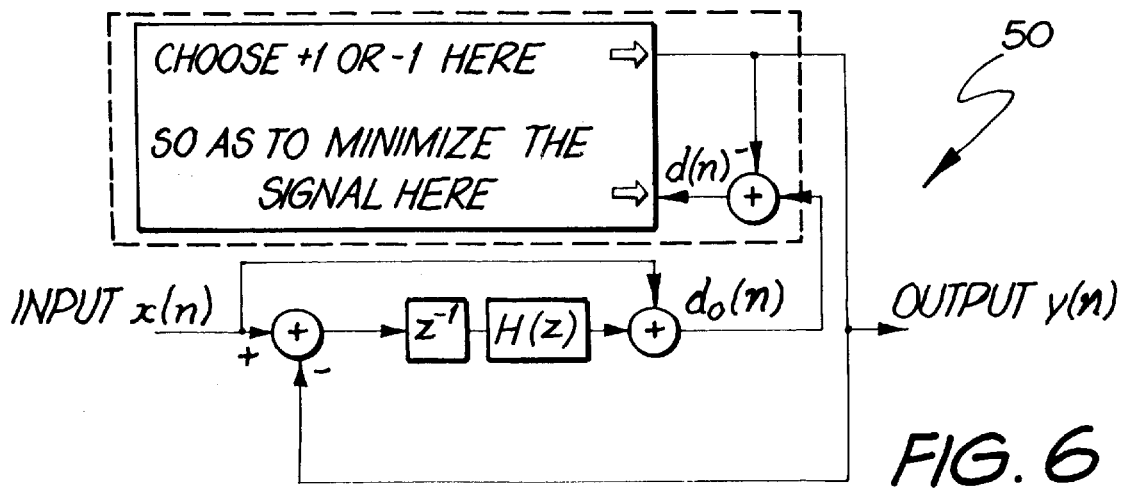
FIG. 6 illustrates schematically a lookahead modulator with direct calculation of d(n)

The arrangements of FIG. 6 and FIG. 7 therefore provide for an improved form of Sigma Delta Modulator having single sample look ahead capabilities.

It would be further appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

I claim:

1. A sigma delta modulator comprising:

a differencing means for forming a difference between a current input signal and a current output signal to produce a difference output;

delay means for storing and delaying said difference output to produce a delayed difference output;

low pass filtering means for low pass filtering said delayed difference output to produce a low pass output;

summing means for summing said delayed difference output with the current input signal to produce a current intermediate output; and quantizing means for quantizing said current intermediate output to produce said current output signal, said current output signal being limited by said quantizing means to one of a number of predetermined output states.

2. A method of deriving a first series of B output samples satisfying a predetermined quantization requirement from a second series of B input samples comprising:

computing the differences between a current input series and potential output series values satisfying the predetermined quantization requirement;

for each said potential output series determining a low frequency part of a successive series of said differences;

amplifying said low frequency parts;

determining one potential output series from said potential output series resulting in a minimum low frequency part; and utilizing said one potential output series as an output signal.

3. A method as claimed in claim 2 wherein said output samples are each quantized to m-bits.

4. A method as claimed in claim 3 wherein m equals 1.

5. A method as claimed in claim 2 wherein said potential output series values are selected from a reduced subset of all potential output series values satisfying said predetermined quantization requirement.

6. A method as claimed in claim 2, wherein said method is repeated for a sequential collection of said series of B input samples, and said determining the low frequency part of successive series of said differences comprises utilizing a previous differences signal from processing of a previous series of B input samples.

7. A method of deriving a first series of quantized output samples satisfying a predetermined quantization requirement from a second series of input samples comprising:

breaking said series of input samples into consecutive input segments of B samples;

and for each said input segment computing the differences between a current input segment and potential quantized output segment values satisfying the predetermined quantization requirement;

for each said potential output segment determining a low frequency part of a successive series of said differences utilizing a filter;

amplifying said low frequency parts;

determining one potential output segment from said potential output segments resulting in a minimum low frequency part;

utilizing said one potential output segment as part of an output signal and storing a state of said filter giving said minimum low frequency part; and utilizing said sate of said filter as an initial state of said filter for processing the next said input segment.

8. A sigma delta modulator comprising:

a differencing circuit configured to form a difference between a current input signal and a current output signal to produce a difference output;

a delay circuit configured to store and delay said difference output to produce a delayed difference output;

a low pass filter configured to low pass filter said delayed difference output to produce a low pass output;

a summing circuit configured to sum said delayed difference output with the current input signal to produce a current intermediate output; and a quantizing circuit configured to quantize said current intermediate output to produce said current output signal, said current output signal being limited by said quantizing circuit to one of a number of predetermined output states.

* * * * *